United States Patent
Kwon et al.

(10) Patent No.: US 11,152,053 B2
(45) Date of Patent: Oct. 19, 2021

(54) MEMORY DEVICES INCLUDING AN OPERATION MODE SUPPORTING VIRTUAL BANK ACCESS, AND OPERATING METHODS OF THE MEMORY DEVICES

(71) Applicant: Samsung Electronics Co., Ltd., Suwon-si (KR)

(72) Inventors: Sang-Hyuk Kwon, Seoul (KR); Nam Sung Kim, Yongin-si (KR); Kyomin Sohn, Yongin-si (KR); Seongil O, Suwon-si (KR); Haesuk Lee, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/994,796

(22) Filed: Aug. 17, 2020

(65) Prior Publication Data

US 2021/0217461 A1 Jul. 15, 2021

(30) Foreign Application Priority Data

Jan. 13, 2020 (KR) .......................... 10-2020-0004421

(51) Int. Cl.
*G11C 11/408* (2006.01)
*G11C 11/4074* (2006.01)
(Continued)

(52) U.S. Cl.
CPC ........ *G11C 11/4087* (2013.01); *G11C 7/1006* (2013.01); *G11C 8/12* (2013.01); *G11C 11/4074* (2013.01); *G11C 11/4076* (2013.01); *G11C 11/4085* (2013.01); *G11C 11/4094* (2013.01); *G11C 11/4096* (2013.01); *G11C 11/40618* (2013.01)

(58) Field of Classification Search
CPC ............ G11C 11/4087; G11C 11/4085; G11C 11/4094; G11C 11/4096; G11C 11/4074; G11C 7/1006; G11C 11/40618; G11C 8/12; G11C 11/4076
See application file for complete search history.

(56) References Cited

U.S. PATENT DOCUMENTS 6,049,502 A 4/2000 Cowles et al.
6,240,046 B1 5/2001 Proebsting
(Continued)

FOREIGN PATENT DOCUMENTS

KR 101866681 6/2018

*Primary Examiner* — Mushfique Siddique
(74) *Attorney, Agent, or Firm* — Myers Bigel, P.A.

(57) ABSTRACT

A memory device includes a memory cell array including a plurality of banks each including a plurality of memory cells connected to a plurality of word lines, and a row decoder block connected to the plurality of banks. In a first operation mode, the row decoder block receives a first row address and a first bank address together with an activation command and activates a word line selected by the first row address from among the plurality of word lines of a bank selected by the first bank address from among the plurality of banks. In a second operation mode, the row decoder block receives a second row address and a second bank address together with the activation command and activates a word line selected by the second row address from among the plurality of word lines of each of at least two banks of the plurality of banks.

20 Claims, 13 Drawing Sheets

(51) Int. Cl.
    *G11C 11/4096* (2006.01)
    *G11C 11/4094* (2006.01)
    *G11C 7/10* (2006.01)
    *G11C 11/406* (2006.01)
    *G11C 8/12* (2006.01)
    *G11C 11/4076* (2006.01)

(56) References Cited

U.S. PATENT DOCUMENTS

| | | |
|---|---|---|
| 8,549,209 B2 | 10/2013 | Pyeon et al. |
| 8,804,455 B2 | 8/2014 | Lee et al. |
| 9,330,765 B2 | 5/2016 | Kim |
| 9,690,502 B2 | 6/2017 | Pawlowski |
| 9,804,793 B2 | 10/2017 | Tomishima et al. |
| 10,297,307 B1 * | 5/2019 | Raad .................. G11C 11/1675 |
| 2006/0181935 A1 | 8/2006 | Choi |
| 2009/0296512 A1 | 12/2009 | Cowles et al. |
| 2012/0224441 A1 | 9/2012 | Ko et al. |
| 2013/0336079 A1 * | 12/2013 | Kim .................. G11C 11/402 365/222 |
| 2014/0126301 A1 * | 5/2014 | Yoon .................. G11C 29/4401 365/189.04 |
| 2016/0027492 A1 * | 1/2016 | Byun ................ G11C 11/40611 365/222 |
| 2017/0017434 A1 | 1/2017 | Bang et al. |
| 2017/0194045 A1 * | 7/2017 | Kang .................. G11C 11/4087 |
| 2017/0336989 A1 * | 11/2017 | Zawodny ............ G06F 15/7821 |
| 2018/0033467 A1 | 2/2018 | Villa |
| 2018/0046666 A1 | 2/2018 | Ahn et al. |
| 2019/0096459 A1 * | 3/2019 | Son .................... G11C 11/4076 |
| 2019/0206460 A1 * | 7/2019 | O ........................ G11C 11/4093 |

\* cited by examiner

MEMORY DEVICES INCLUDING AN OPERATION MODE SUPPORTING VIRTUAL BANK ACCESS, AND OPERATING METHODS OF THE MEMORY DEVICES

CROSS-REFERENCE TO RELATED APPLICATION

This application claims priority under 35 U.S.C. § 119 to Korean Patent Application No. 10-2020-0004421, filed on Jan. 13, 2020, in the Korean Intellectual Property Office, the disclosure of which is incorporated by reference herein in its entirety.

BACKGROUND

Embodiments of the inventive concepts relate to semiconductor devices, and more particularly, relate to memory devices with an improved speed, memory modules, and operating methods of the memory devices.

A memory device is used to store data. A memory device that permits a random access to any memory space may be referred to as a "random access" memory device or just a random access memory. The random access memory may have an operating speed higher than other memories. Accordingly, in a computing device, the random access memory may be used as a main memory that is directly accessed by a central processing unit (CPU).

In the computing device, a communication speed between the central processing unit and the random access memory may act as a bottleneck. The communication speed between the central processing unit and the random access memory may be slower than a calculation speed of the central processing unit and an operating speed of the random access memory. To solve this issue, attempts have been made to delegate a part of the calculations that would otherwise be performed by the central processing unit to the random access memory.

A random access memory that performs some of the calculations for the CPU may be called a "processor in memory (PIM)" or a "function in memory (FIM)." Because the random access memory performs some calculations for the CPU, the communication between the central processing unit and the random access memory may decrease, and thus, the bottleneck may be improved and/or reduced.

SUMMARY

Embodiments of the inventive concepts provide memory devices including an operation mode supporting embedded calculation functions, memory modules, and operating methods of the memory devices.

According to an example embodiment, a memory device includes a memory cell array including a plurality of banks each including a plurality of memory cells connected to a plurality of word lines, and a row decoder block connected to the plurality of banks. In a first operation mode, the row decoder block receives a first row address and a first bank address together with an activation command and activates a first word line selected by the first row address from among the plurality of word lines of a bank selected by the first bank address from among the plurality of banks. In a second operation mode, the row decoder block receives a second row address and a second bank address together with the activation command and activates a second word line selected by the second row address from among the plurality of word lines of each of at least two banks of the plurality of banks.

According to an example embodiment, an operating method of a memory device which includes a memory cell array including a plurality of banks each including a plurality of memory cells connected to a plurality of word lines includes, in a first operation mode, activating one bank among the plurality of banks and accessing the bank that is activated and, in a second operation mode, activating at least two banks among the plurality of banks as one virtual bank and accessing the virtual bank that is activated.

According to an example embodiment, a memory module includes a plurality of memory devices, and a driver that receives a command and an address from an external host device and transfers the command and the address to the plurality of memory devices. Each of the plurality of memory devices includes a memory cell array including a plurality of banks each including a plurality of memory cells connected to a plurality of word lines, and a row decoder block connected to the plurality of banks. In a first operation mode, the row decoder block receives a first row address and a first bank address as the address together with an activation command and activates a first word line selected by the first row address from among the plurality of word lines of a bank selected by the first bank address from among the plurality of banks. In a second operation mode, the row decoder block receives a second row address and a second bank address as the address together with the activation command and activates a second word line selected by the second row address from among the plurality of word lines of each of at least two banks of the plurality of banks.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, embodiments of the inventive concepts may be described in detail and clearly to such an extent that one of ordinary skill in the art may implement the embodiments of the inventive concepts.

Figure 1:
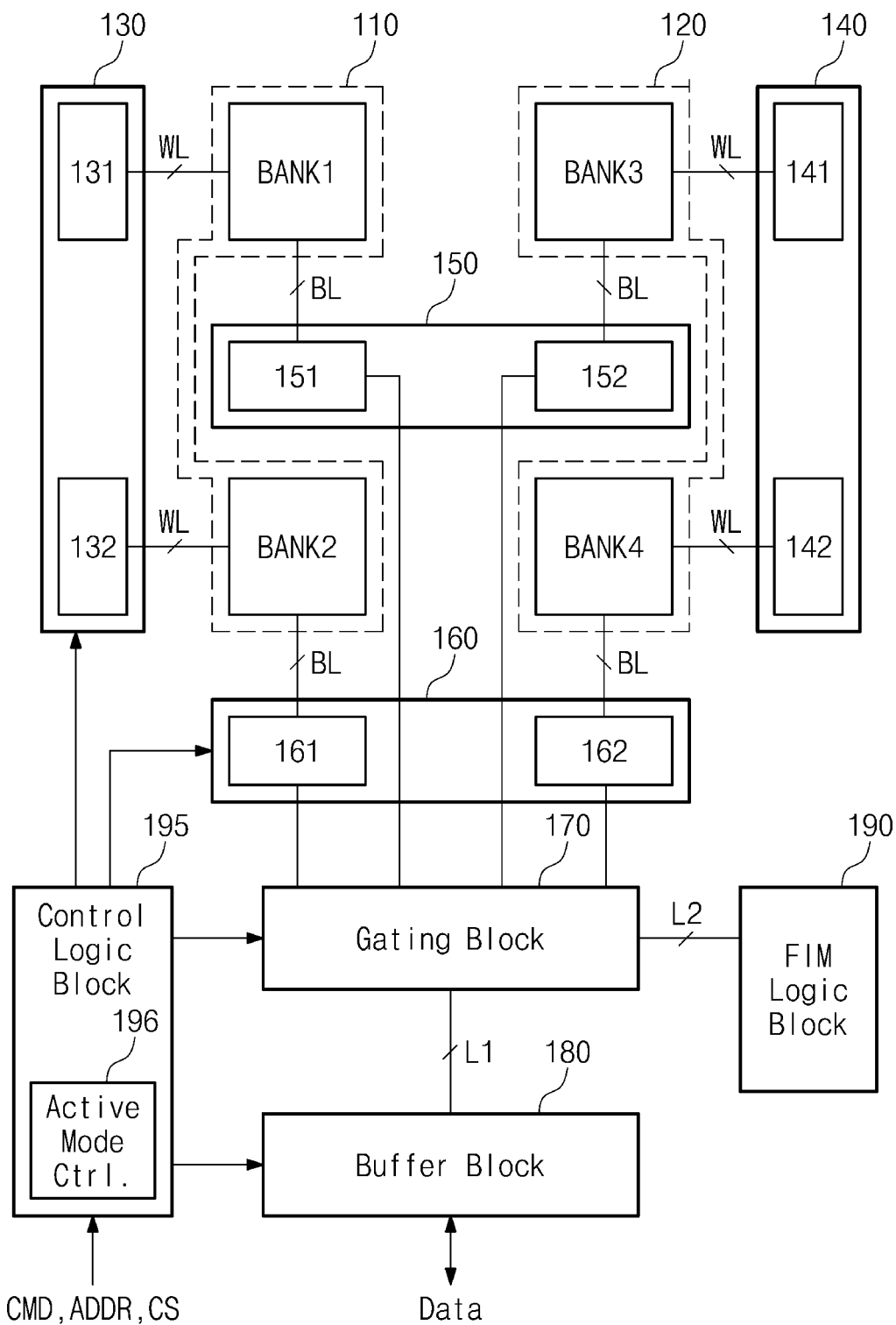
FIG. 1 illustrates a memory device according to an embodiment of the inventive concepts.

FIG. 1 illustrates a memory device 100 according to an embodiment of the inventive concepts. The memory device 100 may be, but is not limited to, a dynamic random access memory (DRAM). The memory device 100 may be one of various random access memories such as static random access memory (SRAM), a magnetic RAM (MRAM), a phase-change RAM (PRAM), a ferroelectric RAM (FRAM), and a resistive RAM (RRAM).

Referring to FIG. 1, the memory device 100 may include a first bank group 110, a second bank group 120, a first decoder block 130, a second decoder block 140, a first access block 150, a second access block 160, a gating block 170, a buffer block 180, a function in memory (FIM) logic block 190, and a control logic block 195.

Each of the first bank group 110 and the second bank group 120 may include two or more banks. The first bank group 110 may include a first bank BANK1 and a second bank BANK2, and the second bank group 120 may include a third bank BANK3 and a fourth bank BANK4.

Each of the first to fourth banks BANK1 to BANK4 may include a plurality of memory cells connected to a plurality of word lines WL. Each of the plurality of word lines WL may be connected to a plurality of memory cells. Memory cells connected to one word line WL may correspond to two or more pages.

A page may be a unit by which a host device (e.g., a central processing unit (CPU)) accesses the memory device 100. A page may correspond to a plurality of memory cells. A size of a page may be different from a size of a unit by which data of the memory device 100 are input and output.

An external host device may request a write or read operation from the memory device 100 in units of a page. Depending on the request of the external host device, the memory device 100 may continuously read data from memory cells in units of a page or may continuously write data in the memory cells in units of a page.

The first decoder block 130 may operate under control of the control logic block 195. The first decoder block 130 may include a first word line decoder block 131 and a second word line decoder block 132. When the first bank BANK1 is selected as an access target, the first word line decoder block 131 may activate the word line selected as the access target from among word lines WL connected to the first bank BANK1. For example, the first word line decoder block 131 may apply a selection voltage to the selected word line.

When the second bank BANK2 is selected as an access target, the second word line decoder block 132 may activate the word line selected as the access target from among word lines WL connected to the second bank BANK2.

The second decoder block 140 may operate under control of the control logic block 195. The second decoder block 140 may include a third word line decoder block 141 and a fourth word line decoder block 142. When the third bank BANK3 is selected as an access target, the third word line decoder block 141 may activate the word line selected as the access target from among word lines WL connected to the third bank BANK3.

When the fourth bank BANK4 is selected as an access target, the fourth word line decoder block 142 may activate the word line selected as the access target from among word lines WL connected to the fourth bank BANK4.

The first access block 150 may operate under control of the control logic block 195. The first access block 150 may include a first bit line access block 151 and a second bit line access block 152. The first bit line access block 151 may be connected to the first bank BANK1 through bit lines BL. The first bit line access block 151 may include a write driver to write data in memory cells connected to an activated word line, and a sense amplifier to read data from the memory cells connected to the activated word line.

The second bit line access block 152 may be connected to the third bank BANK3 through bit lines BL. The second bit line access block 152 may include a write driver and a sense amplifier.

The second access block 160 may operate under control of the control logic block 195. The second access block 160 may include a third bit line access block 161 and a fourth bit line access block 162. The third bit line access block 161 may be connected to the second bank BANK2 through bit lines BL. The third bit line access block 161 may include a write driver and a sense amplifier.

The fourth bit line access block 162 may be connected to the fourth bank BANK4 through bit lines BL. The fourth bit line access block 162 may include a write driver and a sense amplifier.

The gating block 170 may operate under control of the control logic block 195. The gating block 170 may control connections between the first access block 150, the second access block 160, the buffer block 180, and the FIM logic block 190. For example, in a first operation mode, the gating block 170 may connect first lines L1 connected to the buffer block 180 with one of the first to fourth bit line access blocks 151, 152, 161, and 162.

The number of lines connecting the gating block 170 with one of the first to fourth bit line access blocks 151, 152, 161, and 162 may be more than the number of first lines L1. The gating block 170 may select some of the lines connecting the gating block 170 with one of the first to fourth bit line access blocks 151, 152, 161, and 162 and may connect the selected lines with the first lines L1.

In a second operation mode, the gating block 170 may electrically connect second lines L2 with at least two of the first to fourth bit line access blocks 151, 152, 161, and 162. For example, the number of second lines L2 may be more than the number of first lines L1. Accordingly, the FIM logic block 190 may use a bandwidth higher than a bandwidth at which the memory device 100 communicates with an external device.

The number of second lines L2 may be equal to, less than, or more than the number of lines connecting the gating block 170 with at least one of the first to fourth bit line access blocks 151, 152, 161, and 162. In some embodiments, the number of second lines L2 may be equal to or less than the number of lines connecting the gating block 170 with the first to fourth bit line access blocks 151, 152, 161, and 162.

The buffer block 180 may operate under control of the control logic block 195. The buffer block 180 may be connected to the gating block 170 through the first lines L1. The buffer block 180 may exchange data with the external host device.

The FIM logic block 190 may operate under control of the control logic block 195. The FIM logic block 190 may perform calculations on data received from the gating block 170. For example, the calculations may include addition, multiplication, subtraction, etc. The FIM logic block 190 may transfer a result of the calculation to the buffer block 180 through the gating block 170 or directly to the buffer block 180.

The control logic block 195 may control operations of components of the memory device 100. The control logic block 195 may receive a command CMD, an address ADDR, and control signals CS from the external host device. The control logic block 195 may control components of the memory device 100 such that an operation requested by the command CMD is performed on memory cells that the address ADDR indicates.

The control logic block 195 may include an active mode control block 196. The active mode control block 196 may adjust a way in which the first decoder block 130 and the second decoder block 140 activate rows (e.g., the word lines WL) of the first to fourth banks BANK1 to BANK4.

In the first operation mode, the memory device 100 may select a bank, which the address ADDR (e.g., a bank address) indicates, from among the first to fourth banks BANK1 to BANK4 and may activate a word line WL, which is selected by the address ADDR (e.g., a row address), from among the word lines WL4 of the selected bank.

The FIM logic block 190 may perform various calculations depending on a request of the external host device. Data that are used for the calculations may be stored in the first to fourth banks BANK1 to BANK4 by the external host device. As calculations are requested by the external host device, the memory device 100 may read data from the first to fourth banks BANK1 to BANK4, and the FIM logic block 190 may perform the calculations by using the read data.

In general, a size of data that are used for calculations is larger than a storage capacity of memory cells connected to one word line of one bank. That is, when data for a calculation are continuously read in response to a calculation request of the host device, at least two rows may have to be activated. This may cause a decrease in an operating speed of the FIM logic block 190.

The active mode control block 196 may support a second operation mode for accelerating a calculation of the FIM logic block 190. Depending on a request of the external host device, the active mode control block 196 may switch between the first operation mode and the second operation mode. Accordingly, the memory device 100 may support different operation modes optimized for a normal access operation and a calculation operation.

Figure 2:
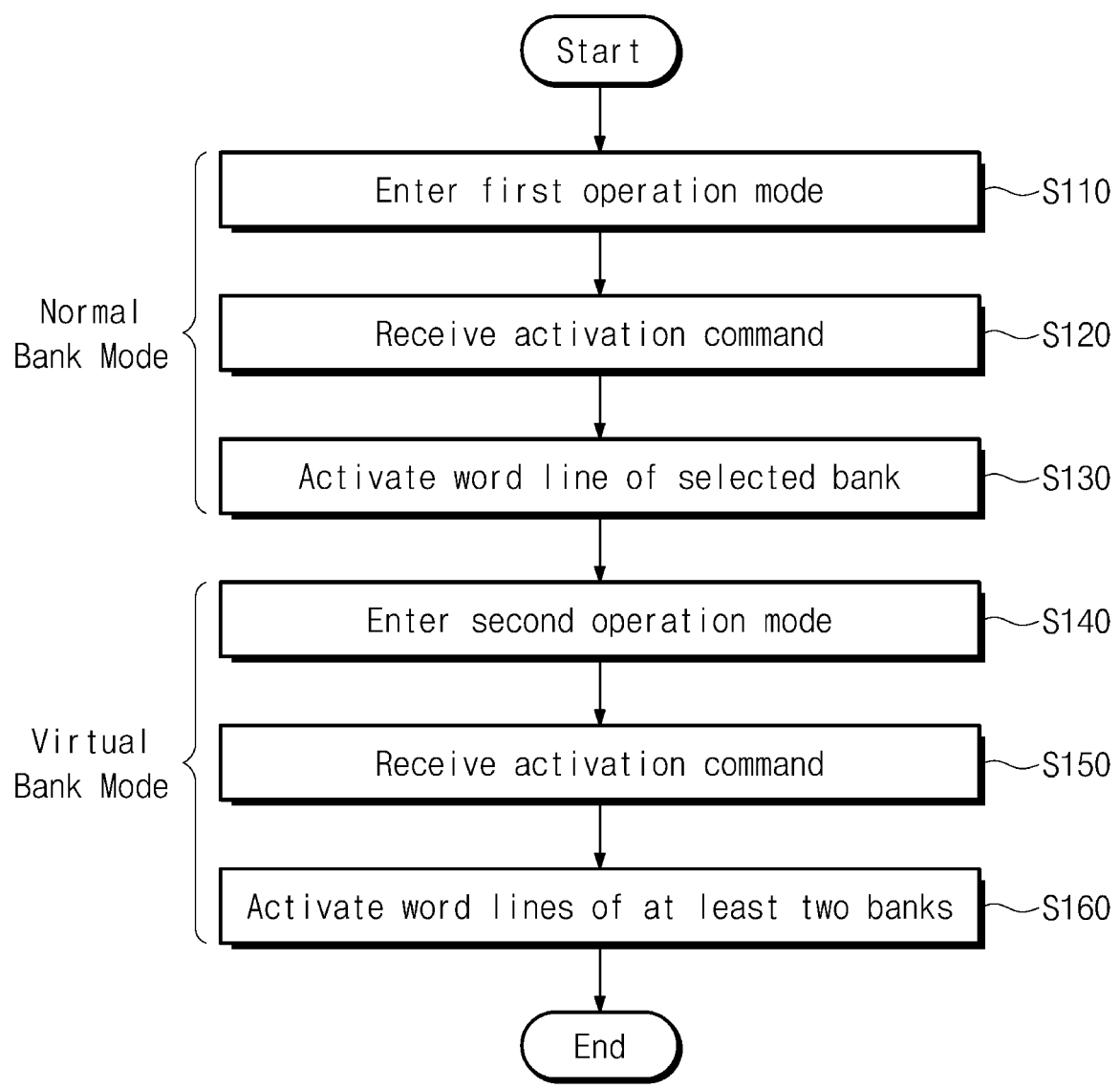
FIG. 2 illustrates an example of an operating method of a memory device according to an embodiment of the inventive concepts.

FIG. 2 illustrates an example of an operating method of the memory device 100 according to an embodiment of the inventive concepts. Referring to FIGS. 1 and 2, in operation S110, the memory device 100 may enter the first operation mode. In operation S120, the control logic block 195 may receive an activation command. In operation S130, the memory device 100 may activate a word line of a selected bank in response to the activation command. Operation S110 to operation S130 may be the first operation mode, which may also be referred to as a normal bank mode.

Figure 3:
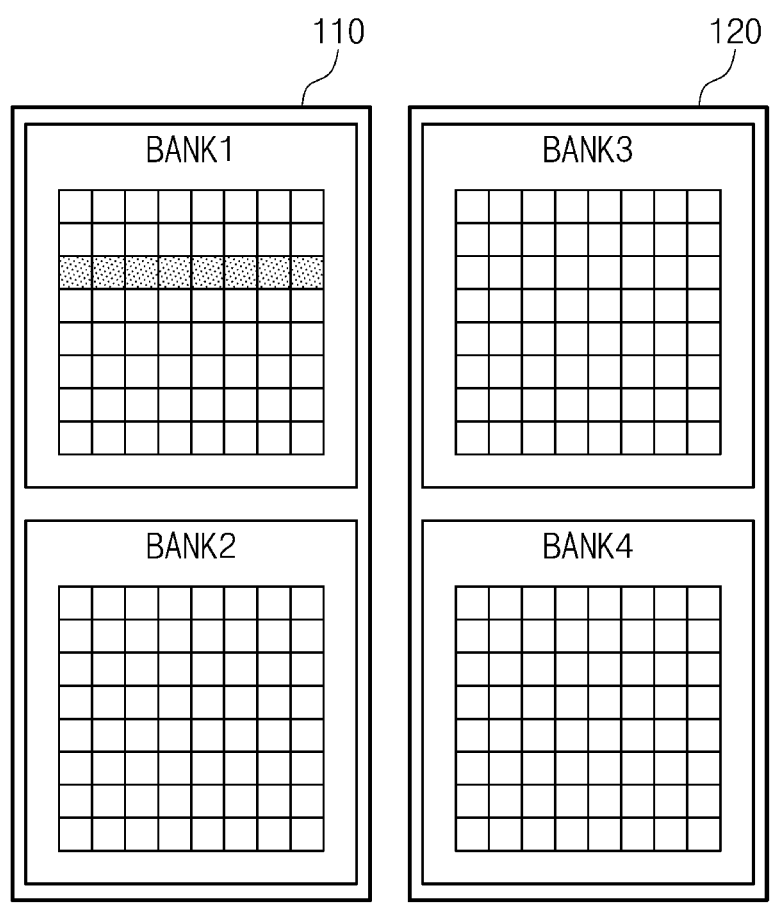
FIG. 3 illustrates an example in which a word line of a bank selected in a first operation mode is activated, according to an embodiment of the inventive concepts.

An example in which a word line of a bank selected in the first operation mode is activated is illustrated in FIG. 3. Referring to FIGS. 1, 2, and 3, in an embodiment, a third row (or a word line WL) of the first bank BANK1 is illustrated (i.e., is filled with dots) as being activated. Dot-filled quadrangles illustrated in FIG. 3 may include a plurality of memory cells connected to the same word line and may correspond to one page.

Returning to FIGS. 1 and 2, in operation 5140, the memory device 100 may enter the second operation mode. In operation S150, the control logic block 195 may receive the activation command. In operation S160, the memory device 100 may activate word lines of at least two banks in response to the activation command. Operation S140 to operation S160 may be the second operation mode, which may also be referred to as a virtual bank mode.

Figure 4:
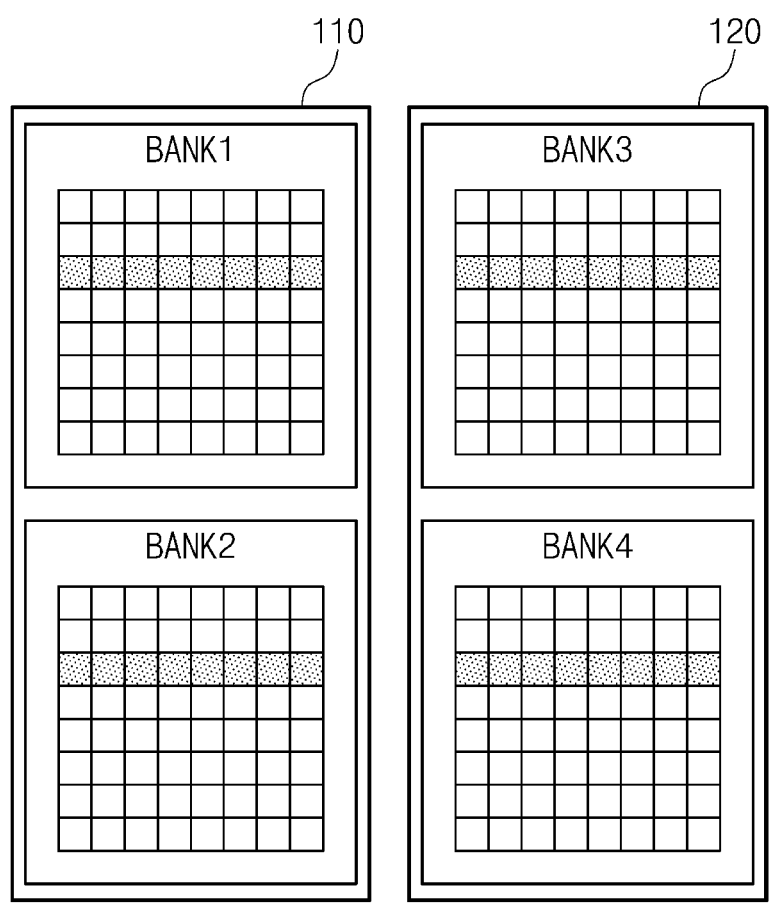
FIG. 4 illustrates an example in which word lines of banks selected in a second operation mode are activated, according to an embodiment of the inventive concepts.

An example in which word lines of banks selected in the second operation mode are activated is illustrated in FIG. 4. Referring to FIGS. 1, 2, and 4, in an embodiment, third rows (or word lines WL) of the first to fourth banks BANK1 to BANK4 are illustrated (i.e., are filled with dots) as being activated. Dot-filled quadrangles illustrated in FIG. 4 may include a plurality of memory cells connected to the same word line and may correspond to one page.

In the second operation mode, because word lines of two or more banks are activated together, the two or more banks may be interpreted as forming one virtual bank. Accordingly, the second operation mode may be called a "virtual bank mode."

Figure 5:
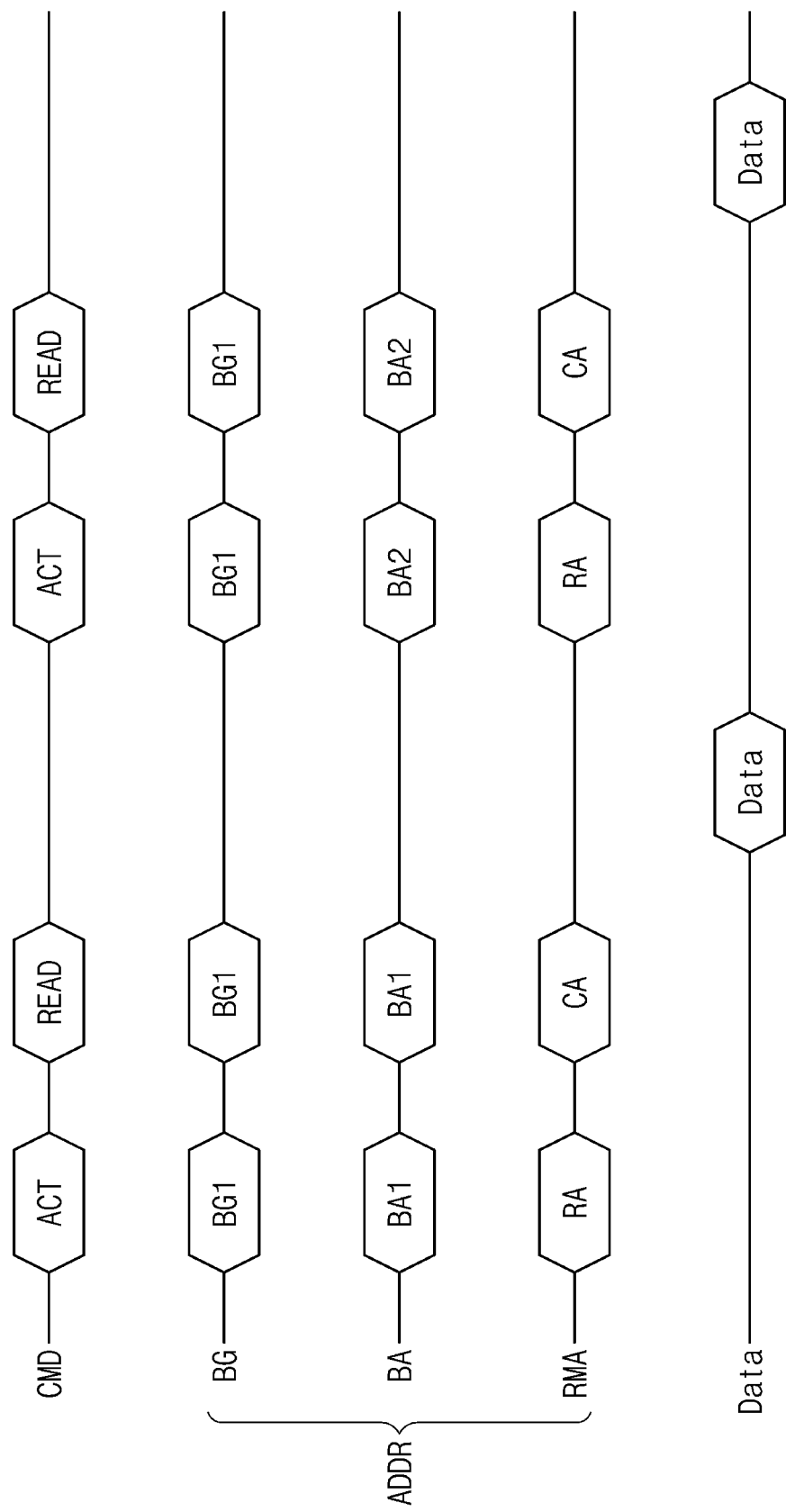
FIG. 5 illustrates an example in which banks are accessed in a second operation mode, according to an embodiment of the inventive concepts.

FIG. 5 illustrates an example in which banks are accessed in the first operation mode. Referring to FIGS. 1, 2, 3, and 5, the command CMD, the address ADDR, and data "Data" are illustrated. The address ADDR may include a bank group address BG, a bank address BA, and a remaining address RMA.

The memory device 100 may receive a first bank group address BG1, a first bank address BA1, and a row address RA together with a first activation command ACT. The memory device 100 may select a bank based on the first bank group address BG1 and the first bank address BA1 and may activate a word line selected by the row address RA from among word lines of the selected bank. Afterwards, accesses to the same row in the same bank may be performed without separate activation.

For example, the memory device 100 may receive a read command READ, the first bank group address BG1, the first bank address BA1, and a column address CA. The memory device 100 may perform a read operation on memory cells selected by the column address CA from among memory cells of the activated row. The memory device 100 may output the read data "Data" to the external host device.

A second activation command ACT may be received together with the first bank group address BG1, a second bank address BA2, and the row address RA. The memory device 100 may select a bank based on the first bank group address BG1 and the second bank address BA2 and may activate a word line selected by the row address RA from among word lines of the selected bank.

Afterwards, the memory device 100 may receive the read command READ, the first bank group address BG1, the second bank address BA2, and the column address CA. The memory device 100 may perform a read operation on memory cells selected by the column address CA from among memory cells of the activated row. The memory device 100 may output the read data "Data" to the external host device.

Figure 6:
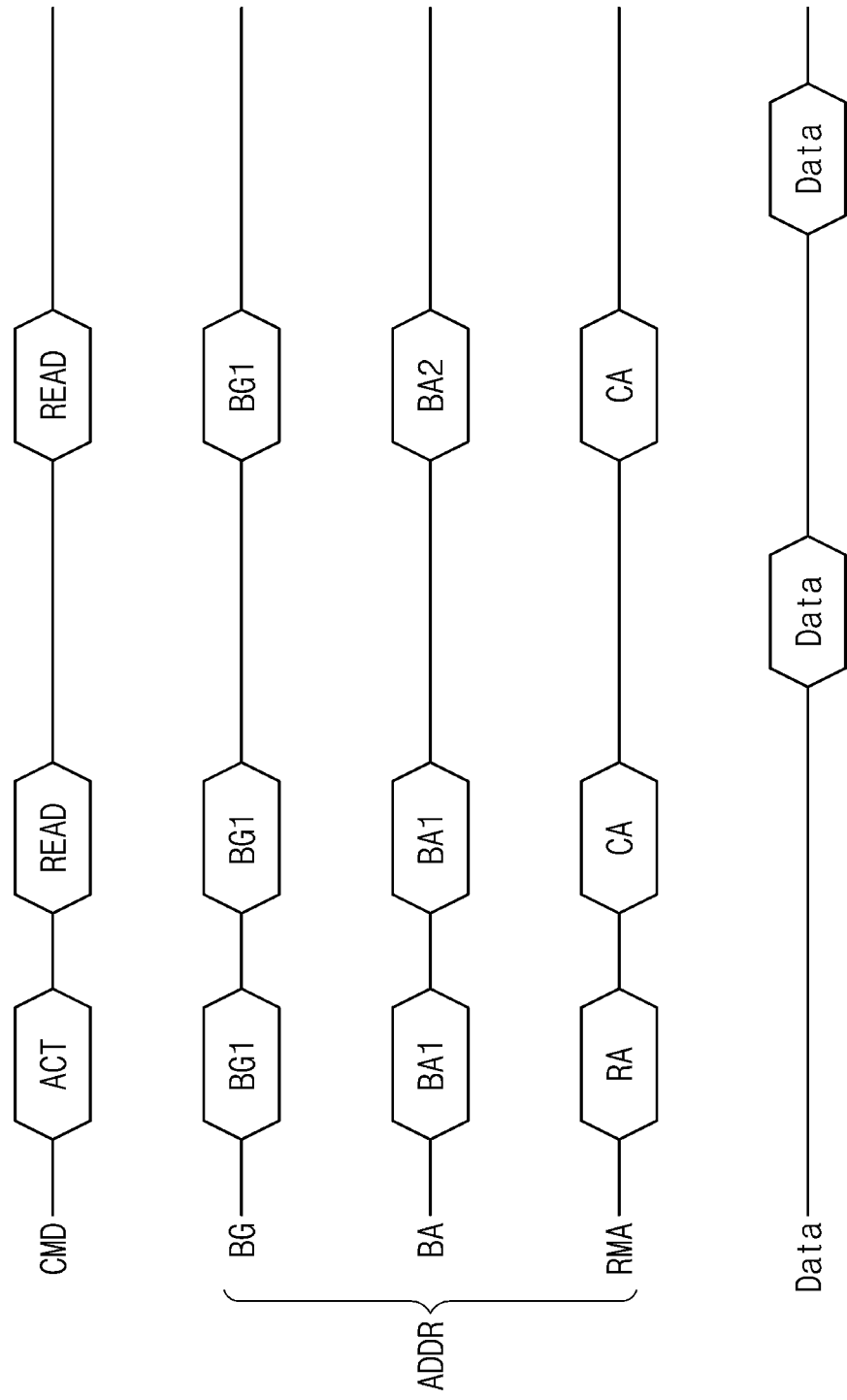
FIG. 6 illustrates an example in which banks are accessed in a second operation mode, according to an embodiment of the inventive concepts.

FIG. 6 illustrates an example in which banks are accessed in the second operation mode. Referring to FIGS. 1, 2, 3, and 6, the command CMD, the address ADDR, and the data "Data" are illustrated. The address ADDR may include the bank group address BG, the bank address BA, and the remaining address RMA.

The memory device 100 may receive the first bank group address BG1, the first bank address BA1, and the row address RA together with a first activation command ACT. Because four banks form one virtual bank, the memory device 100 may activate word lines of the first to fourth banks BANK1 to BANK4, which are selected by the row address RA. Afterwards, accesses to the same rows of the first to fourth banks BANK1 to BANK4 may be performed without separate activation.

For example, the memory device 100 may receive the read command READ, the first bank group address BG1, the first bank address BA1, and the column address CA. The memory device 100 may perform a read operation on memory cells selected by the column address CA from among memory cells of the activated row (e.g., in each of the first to fourth banks BANK1 to BANK4). The memory device 100 may output the read data "Data" to the FIM logic block 190.

Afterwards, the memory device 100 may receive the read command READ, the first bank group address BG1, the second bank address BA2, and the column address CA. The memory device 100 may perform a read operation on memory cells selected by the column address CA from among memory cells of the activated row (e.g., in each of the first to fourth banks BANK1 to BANK4). The memory device 100 may output the read data "Data" to the FIM logic block 190.

Because the activation command ACT is not used to access different banks, a calculation speed of the FIM logic block 190 may be improved. The external host device may store data to be calculated by using the FIM logic block 190 at rows, which correspond to the same address, from among rows of banks forming a virtual bank, and thus, the calculation of the FIM logic block 190 may be accelerated.

In an embodiment, a read command READ or an address ADDR that causes data to be transferred to the FIM logic block 190 may be different from a read command READ or an address ADDR that causes data to be transferred to the external host device. The memory device 100 may determine whether to transfer data to the FIM logic block 190 or the external host device based on the read command READ and/or the address ADDR.

In an embodiment, in the second operation mode, the memory device 100 may perform a read or write operation based on the bank group address BG, the bank address BA, and the column address CA. The bank group address BG and the bank address BA may be interpreted as being used as an extended column address for identifying locations of memory cells at an activated row of a virtual bank.

In an embodiment, to prevent a stress such as hammering, locations of rows of the first to fourth banks BANK1 to BANK4, which are activated by the same row address, may be different. The technical idea of the inventive concepts is not limited to the example in which rows of the same location are activated in at least two banks in the second operation mode. The technical idea of the inventive concepts may be interpreted as rows corresponding to the same row address are activated in at least two banks in the second operation mode.

In an embodiment, the first operation mode and the second operation mode may be determined depending on whether a toggle of a given signal exists before the activation command ACT. In the case where the given signal has not been toggled and/or received before the activation command ACT, it may be determined that a corresponding activation command ACT and access commands following the corresponding activation command ACT belong to the first operation mode. In the case where the given signal is toggled and/or received before the activation command ACT, it may be determined that a corresponding activation command ACT and access commands following the corresponding activation command ACT belong to the second operation mode.

When the given signal is toggled at least once with a given pattern, the toggle of the given signal may be determined. In some embodiments, whether the given signal has a predetermined value may be determined. The given signal may be at least one of signals forming the address ADDR. The given signal may be at least one of signals of the address ADDR, which are associated with the activation command ACT. The given signal may include at least one of signals of the bank group address BG, the bank address BA, and the remaining address RMA.

In an embodiment, an example in which data are transferred to the FIM logic block 190 through a read command is described. However, data may be written in the first to fourth banks BANK1 to BANK4 through a write command on a virtual bank basis.

For example, when the external host device writes data to be used for a calculation of the FIM logic block 190, a virtual bank may be used. The active mode control block 196 may further support a third operation mode. In the third operation mode, at least two banks may form a virtual bank, and the gating block 170 may connect the first lines L1 connected to the buffer block 180 with lines connected to the first to fourth banks BANK1 to BANK4.

The external host device may write data at a row of a virtual bank including at least two banks without a separate activation command except for a first activation command ACT. Accordingly, a data write speed may be improved.

Figure 7:
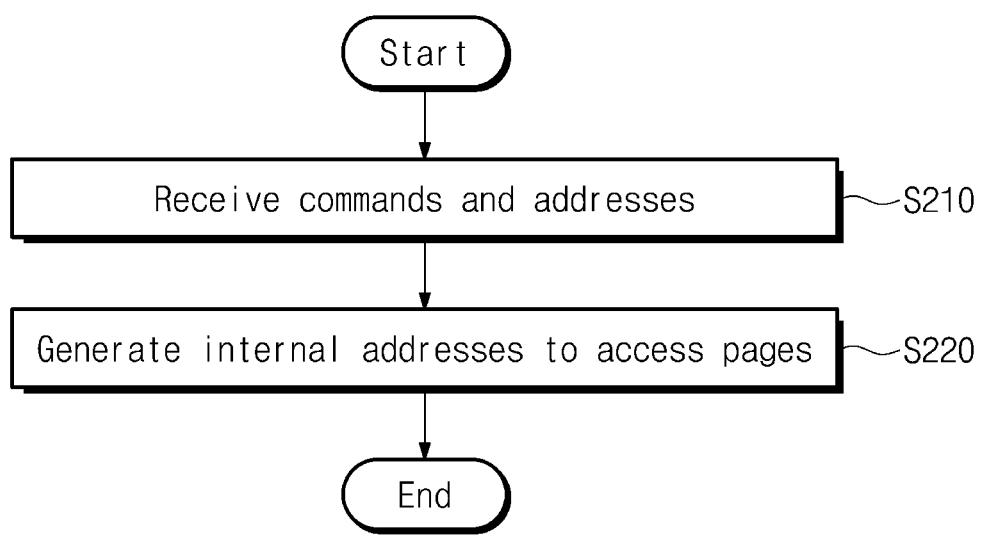
FIG. 7 illustrates an example in which a memory device generates an internal address in a second operation mode, according to an embodiment of the inventive concepts.

FIG. 7 illustrates an example in which the memory device 100 generates an internal address in the second operation mode, according to an embodiment of the inventive concepts. Referring to FIGS. 1, 2, and 7, in operation S210, the memory device 100 may receive commands and addresses. The commands may be read commands or write commands. In the second operation mode, only one type of command, a read command or a write command, may be allowed, and a combination of a read command and a write command may not be allowed.

In operation S220, the memory device 100 may generate internal addresses to access pages. For example, the memory device 100 may generate internal addresses in compliance with a given rule, regardless of addresses received in operation S210.

Figure 8:
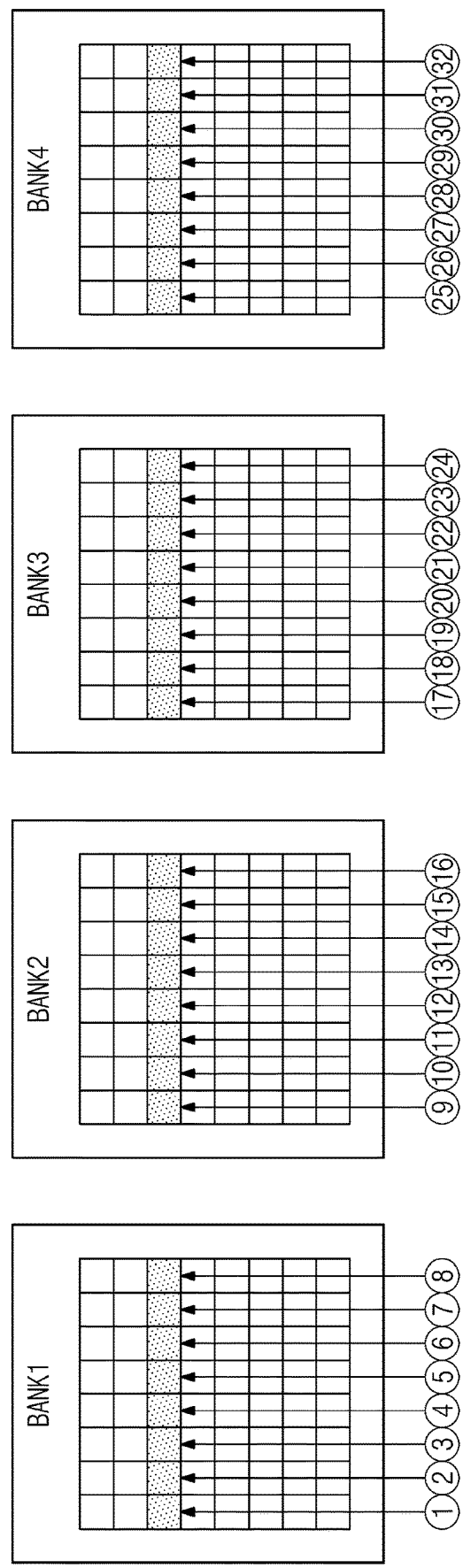
FIG. 8 illustrates an example in which internal addresses are generated in compliance with a first rule, according to an embodiment of the inventive concepts.

FIG. 8 illustrates an example in which internal addresses are generated in compliance with a first rule, according to an embodiment of the inventive concepts. Referring to FIGS. 1 and 8, the first bank BANK1 may be selected, and pages of the first bank BANK1 may be sequentially accessed (e.g., pages 1 to 8). Afterwards, the second bank BANK2 may be selected, and pages of the second bank BANK2 may be sequentially accessed (e.g., pages 9 to 16).

Afterwards, the third bank BANK3 may be selected, and pages of the third bank BANK3 may be sequentially accessed (e.g., pages 17 to 24). Afterwards, the fourth bank BANK4 may be selected, and pages of the fourth bank BANK4 may be sequentially accessed (e.g., pages 25 to 32).

That is, the memory device 100 may generate internal addresses in a way to sequentially scan pages of the first to fourth banks BANK1 to BANK4.

Figure 9:
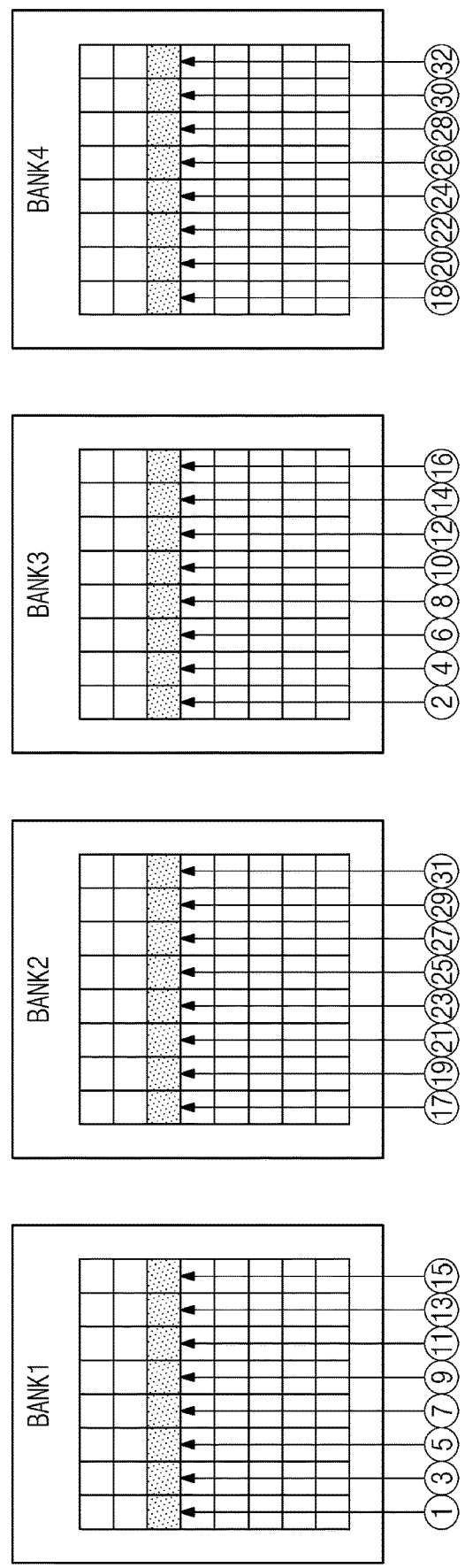
FIG. 9 illustrates an example in which internal addresses are generated in compliance with a second rule, according to an embodiment of the inventive concepts.

FIG. 9 illustrates an example in which internal addresses are generated in compliance with a second rule, according to an embodiment of the inventive concepts. Referring to FIGS. 1 and 9, the first and third banks BANK1 and BANK3 may be selected, and pages of the first and third banks BANK1 and BANK3 may be alternately and sequentially accessed (e.g., pages 1 to 16). Afterwards, the second and fourth banks BANK2 and BANK4 may be selected, and pages of the second and fourth banks BANK2 and BANK4 may be alternately and sequentially accessed (e.g., pages 17 to 32).

That is, the memory device 100 may generate internal addresses such that pages belonging to different bank groups are alternately accessed. A speed at which different bank groups are alternately accessed is higher than a speed at which the same bank group is accessed. Accordingly, a speed of the memory device 100 in the second operation mode may be improved.

Figure 10:
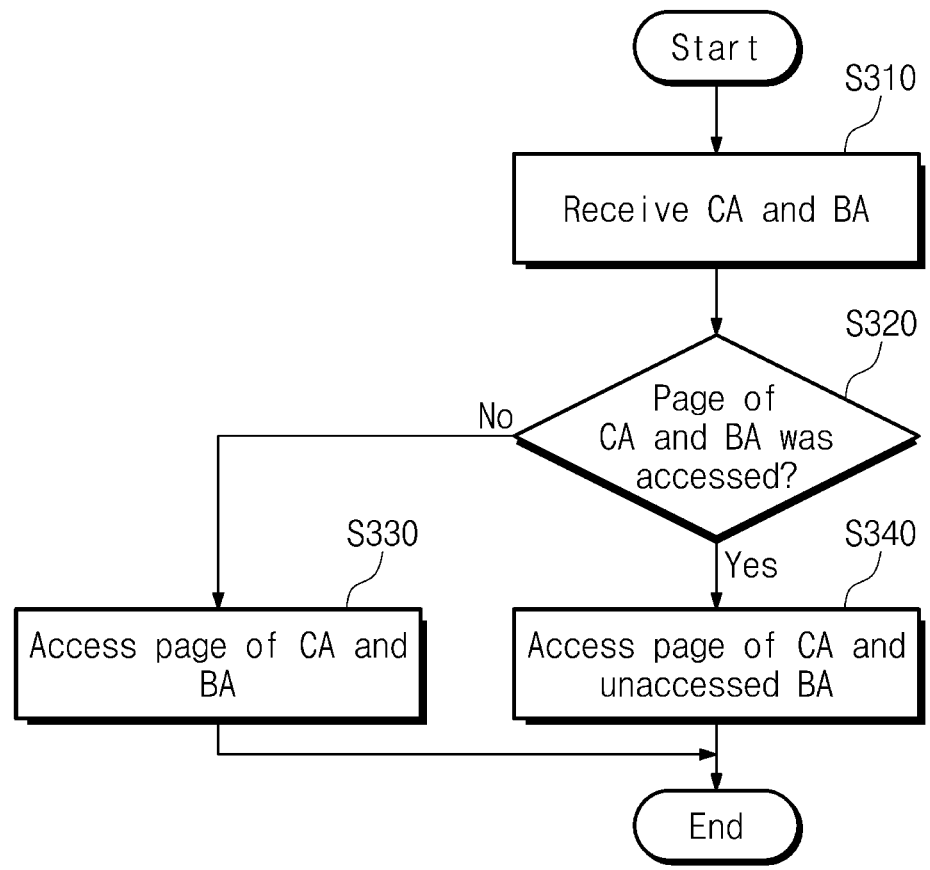
FIG. 10 illustrates an example in which internal addresses are generated in compliance with a third rule, according to an embodiment of the inventive concepts.

FIG. 10 illustrates an example in which internal addresses are generated in compliance with a third rule, according to an embodiment of the inventive concepts. Referring to FIGS. 1 and 10, in operation S310, the memory device 100 may receive the column address CA and the bank address BA. The external host device may allocate one bank address to a virtual bank in the second operation mode. Accordingly, a bank address received from the external host device may be fixed (e.g., to "BA1").

In operation S320, the memory device 100 may determine whether a page of the column address CA and the bank address BA was accessed. When the page of the column address CA and the bank address BA was not accessed, in operation S330, the memory device 100 may access the page of the column address CA and the bank address BA.

When the page of the column address CA and the bank address BA was accessed, in operation S340, the memory device 100 may access a page of the column address CA and an actual bank address BA (not a bank address of a virtual bank) that has not yet been accessed.

For example, the memory device 100 may include a counter. When an access of a specific column address CA and a specific bank address BA (e.g., a bank address of a virtual bank) is requested from the external host device, the memory device 100 may increase a count. The memory device 100 may use the count as the actual bank address BA.

Figure 11:
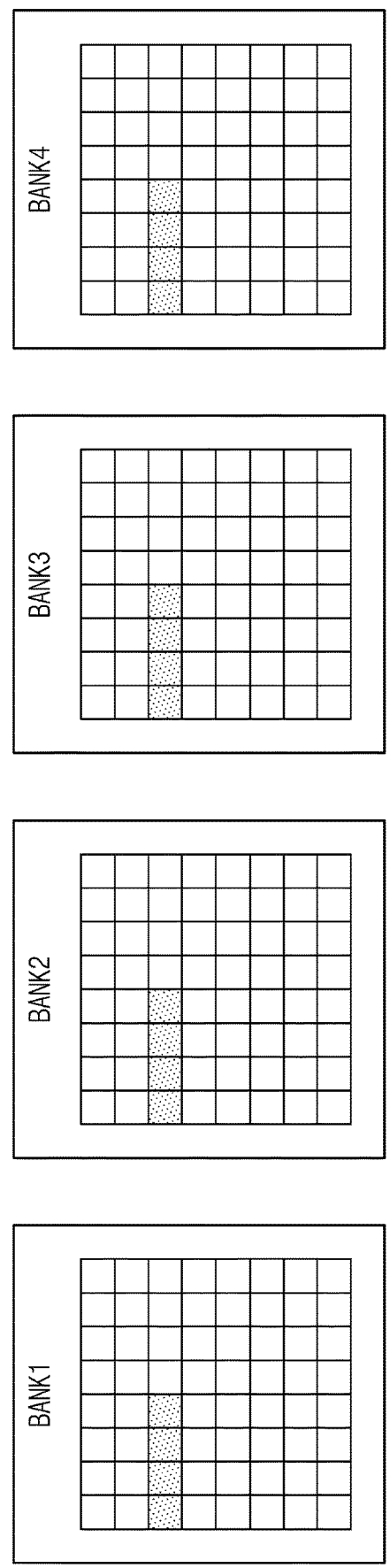
FIG. 11 illustrates an example in which an access to some pages is inhibited in a second operation mode, according to an embodiment of the inventive concepts.

FIG. 11 illustrates an example in which an access to some pages is inhibited in the second operation mode, according to an embodiment of the inventive concepts. Referring to FIGS. 1 and 11, third rows of first to fourth banks BANK1 to BANK4 may be activated. In each of the activated rows, an access to a first half of a page may be allowed, and an access to a second half of the page may be inhibited.

For example, the memory device 100 may generate internal addresses associated with only a half of the pages of the row. The number or a ratio of pages access-inhibited in the second operation mode may be set by the external host device.

Figure 12:
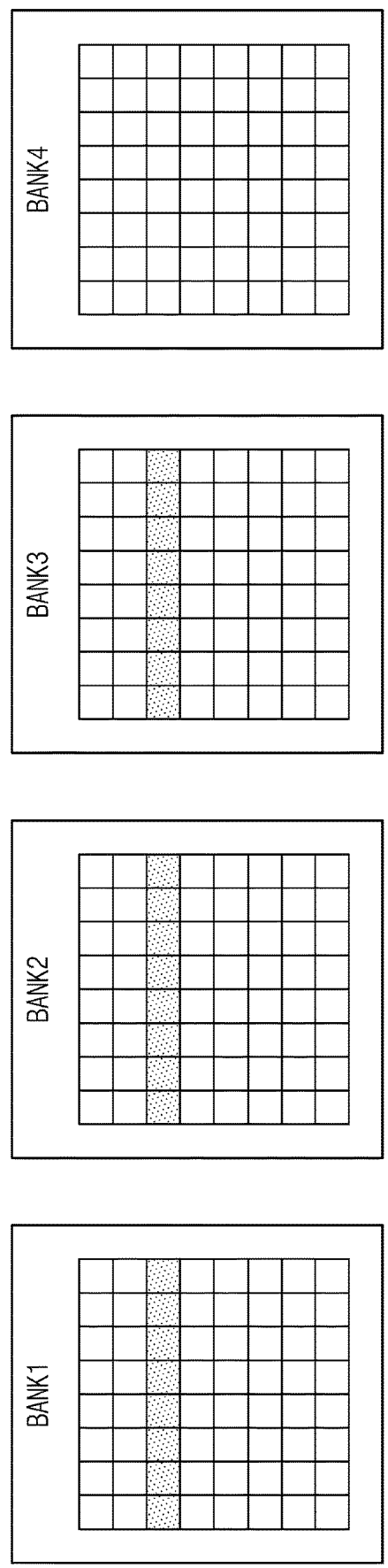
FIG. 12 illustrates an example in which the number of banks included in a virtual bank varies, according to an embodiment of the inventive concepts.

FIG. 12 illustrates an example in which the number of banks included in a virtual bank varies, according to an embodiment of the inventive concepts.

Referring to FIGS. 1 and 12, the memory device 100 may activate rows of three banks (e.g., the first to third banks BANK1 to BANK3) of the first to fourth banks BANK1 to BANK4. The number of banks to be included in a virtual bank may be set by the external host device.

The external host device may adjust the number of banks to be included in a virtual bank, based on banks in which data to be calculated by the FIM logic block 190 are stored. As the fourth bank BANK4 is not activated, power consumption of the memory device 100 may be reduced. In an embodiment, the memory device 100 may identify the number of banks to be included in a virtual bank, based on signals received before the activation command ACT.

Figure 13:
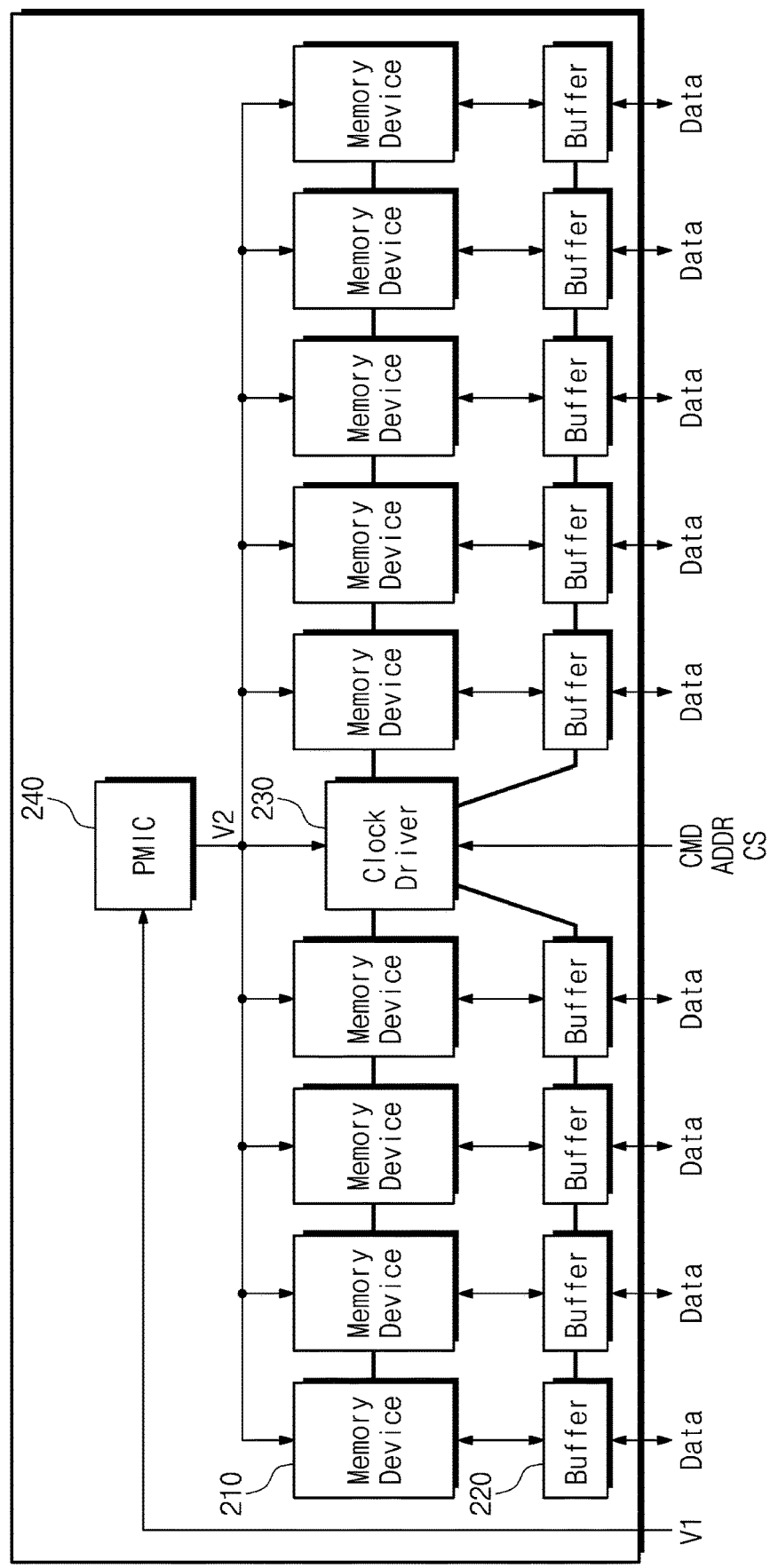
FIG. 13 illustrates a memory module according to an embodiment of the inventive concepts

FIG. 13 illustrates a memory module 200 according to an embodiment of the inventive concepts. Referring to FIG. 13, the memory module 200 may include memory devices 210, buffers 220, a clock driver 230, and a power management integrated circuit (PMIC) 240.

Each of the memory devices 210 may include the memory device 100 described with reference to FIGS. 1 to 12. Each of the memory devices 210 may support the first operation mode in which a row of one bank is activated, and the second operation mode in which two or more banks form a virtual bank and a row of the virtual bank is activated. Each of the memory devices 210 may include an FIM logic block to perform given calculations in the second operation mode.

The buffers 220 may exchange the data "Data" between the external host device and the memory devices 210. The buffers 220 may operate under control of the clock driver 230.

The clock driver 230 may receive the command CMD, the address ADDR, and the control signals CS from the external host device. The clock driver 230 may transfer the command CMD, the address ADDR, and the control signals CS to the memory devices 210.

The PMIC 240 may receive first voltages V1 from the external host device. The PMIC 240 may generate second voltages V2 from the first voltages V1. The PMIC 240 may supply the second voltages V2 to the memory devices 210, the buffers 220, and the clock driver 230. In an embodiment, the PMIC 240 may be optional and may be omitted.

In an embodiment, the memory module 200 may be based on a load reduced dual in-line memory module (LRDIMM). When the buffers 220 are removed and the memory devices 210 is modified to directly exchange data with the external host device, the memory module 200 may be based on a registered DIMM (RDIMM).

When the clock driver 230 is removed and the memory devices 210 is modified to directly receive the command CMD, the address ADDR, and the control signals CS from the external host device, the memory module 200 may be based on a unbuffered DIMM (UDIMM).

In the above embodiments, components according to the inventive concepts are described by using the terms "first," "second," "third," and the like. However, the terms "first," "second," "third," and the like may be used to distinguish components from each other and do not limit the inventive concepts. For example, the terms "first," "second," "third," and the like do not involve an order or a numerical meaning of any form.

In the above embodiments, components according to embodiments of the inventive concepts are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concepts, an operation mode in which word lines of two or more banks are simultaneously activated is supported. Accordingly, a memory device, a memory module, and an operating method, which are capable of improving a speed at which embedded calculations are performed, are provided.

While the inventive concepts has been described with reference to example embodiments thereof, it will be apparent to those of ordinary skill in the art that various changes and modifications may be made thereto without departing from the scope of the inventive concepts as set forth in the following claims.

What is claimed is:

1. A memory device comprising:
a memory cell array comprising a plurality of banks each comprising a plurality of memory cells connected to a plurality of word lines;
a control logic block; and
a row decoder block connected to the plurality of banks,
wherein, in a first operation mode, the row decoder block is configured to receive a first row address and a first bank address together with an activation command and to activate a first word line selected by the first row address from among the plurality of word lines of a bank selected by the first bank address from among the plurality of banks,
wherein, in a second operation mode, the row decoder block is configured to receive a second row address and a second bank address together with the activation command and to activate a second word line selected by the second row address from among the plurality of word lines of each of at least two banks of the plurality of banks, and
wherein the control logic block is configured to:
receive an address and a command from an external host device,
before the activation command is received, enter the second operation mode in response to at least one signal among signals of the address; and
before the activation command is received, enter the first operation mode in response to comparing the at least one signal to a predetermined value.

2. The memory device of claim 1, wherein the at least one signal comprises a portion of the first row address and/or the second row address.

3. The memory device of claim 1, further comprising:
a bit line access block configured to access memory cells of different banks without an additional activation command in the second operation mode.

4. The memory device of claim 1,
wherein the control logic block is further configured to generate an internal column address for accessing the selected second word line, in response to receiving, in the second operation mode, a write command or a read command as the command following the activation command together with an associated column address.

5. The memory device of claim 4, wherein the control logic block is further configured to generate the internal column address regardless of the associated column address.

6. The memory device of claim 4, wherein the control logic block is further configured to generate the internal column address and an internal bank address such that memory cells corresponding to the selected second word line from among memory cells of one bank among the plurality of banks are sequentially accessed and then memory cells corresponding to the selected second word line from among memory cells of another bank are sequentially accessed.

7. The memory device of claim 4, wherein the control logic block is further configured to generate the internal column address and an internal bank address such that first memory cells corresponding to the selected second word line from among memory cells of a first bank among the plurality of banks and second memory cells corresponding to the selected second word line from among memory cells of a second bank are alternately accessed.

8. The memory device of claim 7, wherein the first memory cells of the first bank and the second memory cells of the second bank are alternately accessed in units of a page, and
wherein the page is an access unit of the external host device.

9. The memory device of claim 7, wherein the first bank and the second bank belong to different bank groups.

10. The memory device of claim 4, wherein, in response to receiving the associated column address and an associated bank address that are identical together with the write command or the read command as the command, the control logic block is further configured to generate the column address as the internal column address and to sequentially increase an internal bank address.

11. The memory device of claim 1, wherein, in the second operation mode, an access to a subset of memory cells of the at least two banks among the plurality of banks that are connected to the selected second word line is inhibited.

12. The memory device of claim 1, wherein a number of the at least two banks is set by a request of the external host device.

13. The memory device of claim 1, further comprising:
a logic block configured to receive data read from the at least two banks and to perform a calculation comprising addition and/or multiplication on the read data in the second operation mode.

14. The memory device of claim 13, wherein a result of the calculation is written in at least one bank among the plurality of banks.

15. An operating method of a memory device that comprises a memory cell array comprising a plurality of banks each comprising a plurality of memory cells connected to a plurality of word lines, the method comprising:
in a first operation mode, activating one bank among the plurality of banks and accessing the bank that is activated; and
in a second operation mode, activating at least two banks among the plurality of banks as one virtual bank and accessing the virtual bank that is activated,
wherein, in the second operation mode, data from the at least two banks among the plurality of banks is provided to a logic block of the memory device, and
wherein the method further comprises performing, by the logic block, a calculation comprising addition and/or multiplication on the data from the at least two banks in the second operation mode.

16. The method of claim 15, wherein, in the first operation mode, data from the one bank among the plurality of banks is provided to an external host.

17. The method of claim 15, further comprising generating an internal column address and an internal bank address for accessing the virtual bank in response to receiving, in the second operation mode, a write command or a read command following an activation command together with an associated column address, wherein the internal column address and the internal bank address are generated such that first memory cells from among memory cells of a first bank of the at least two banks that are activated among the plurality of banks are sequentially accessed and then second memory cells from among memory cells of a second bank of the at least two banks are sequentially accessed or are generated such that the first memory cells and the second memory cells are alternately accessed.

18. The method of claim 15, wherein, in the second operation mode, an access to a subset of memory cells of the at least two banks that are activated among the plurality of banks is inhibited.

19. A memory module comprising:
a plurality of memory devices; and
a driver configured to receive a command and an address from an external host device and to transfer the command and the address to the plurality of memory devices,
wherein each of the plurality of memory devices comprises:
a memory cell array comprising a plurality of banks each comprising a plurality of memory cells connected to a plurality of word lines;
a control logic block; and
a row decoder block connected to the plurality of banks,
wherein, in a first operation mode, the row decoder block is configured to receive a first row address and a first bank address as the address together with an activation command and to activate a first word line selected by the first row address from among the plurality of word lines of a bank selected by the first bank address from among the plurality of banks,
wherein, in a second operation mode, the row decoder block is configured to receive a second row address and a second bank address as the address together with the activation command and to activate a second word line selected by the second row address from among the plurality of word lines of each of at least two banks of the plurality of banks,
wherein the control logic block is configured to, before the activation command is received, enter the second operation mode in response to at least one signal among signals of the address, and
wherein the at least one signal comprises a portion of the first row address and/or the second row address.

20. The memory module of claim 19, further comprising:
a plurality of buffers configured to exchange data between the plurality of memory devices and the external host device under control of the driver; and
a power management circuit configured to receive first voltages from the external host device, to generate second voltages from the first voltages, and to supply the second voltages to the plurality of memory devices, the driver, and the buffers.

* * * * *